US012810906B2

(12) United States Patent
Ravsher et al.

(10) Patent No.: US 12,810,906 B2
(45) Date of Patent: Nov. 24, 2026

(54) CROSS POINT MEMORY DEVICE

(71) Applicants: IMEC VZW, Leuven (BE); Katholieke Universiteit Leuven, Leuven (BE)

(72) Inventors: Taras Ravsher, Heverlee (BE); Andrea Fantini, Heverlee (BE)

(73) Assignees: Imec vzw, Leuven (BE); Katholieke Universiteit Leuven, Leuven (BE)

( * ) Notice: Subject to any disclaimer, the term of this patent is extended or adjusted under 35 U.S.C. 154(b) by 53 days.

(21) Appl. No.: 18/989,389

(22) Filed: Dec. 20, 2024

(65) Prior Publication Data

US 2025/0210069 A1 Jun. 26, 2025

(30) Foreign Application Priority Data

Dec. 22, 2023 (EP) .................................... 23220097

(51) Int. Cl.
*G11C 5/06* (2006.01)
*G11C 13/00* (2006.01)
(Continued)

(52) U.S. Cl.
CPC ............ *G11C 5/063* (2013.01); *G11C 13/004* (2013.01); *G11C 13/0069* (2013.01);
(Continued)

(58) Field of Classification Search
CPC ... G11C 5/063; G11C 13/004; G11C 13/0069; G11C 2013/0045; G11C 2213/72;
(Continued)

(56) References Cited

U.S. PATENT DOCUMENTS 4,322,695 A 3/1982 Fleming et al.
4,947,142 A 8/1990 Tayrani
(Continued)

OTHER PUBLICATIONS

Ali et al., "Area Efficient Shared Diode Multi-Level Cell SOT-MRAM," IEEE Transaction on Magnetics, Nov. 2018, 5 pages, vol. 54, No. 11.
(Continued)

*Primary Examiner* — Xiaochun L Chen
(74) *Attorney, Agent, or Firm* — McDonnell Boehnen Hulbert & Berghoff LLP

(57) ABSTRACT

A cross point memory device includes: first access lines and second access lines defining a plurality of cross points; and a memory cell connected between the first access lines and the second access lines at each cross point and including a resistive memory element switchable between a first resistance state and a second resistance state. Each first access line includes a metal layer and a semiconductor layer extending continuously in the first direction to define a distributed Schottky diode forming a respective selector device of each memory cell. Internal nodes of each pair of consecutive memory cells along each respective first access line are connected by a respective segment of the semiconductor layer defining a semiconductor channel configured to be gated by the metal layer of its associated first access line. The memory device also includes read circuitry configured to read the resistive memory element of a selected memory cell.

20 Claims, 7 Drawing Sheets

(51) Int. Cl.
*H10B 63/00* (2023.01)
*H10N 70/00* (2023.01)

(52) U.S. Cl.
CPC ............. *H10B 63/20* (2023.02); *H10B 63/84* (2023.02); *H10N 70/883* (2023.02)

(58) Field of Classification Search
CPC ............ G11C 11/1659; G11C 11/1673; G11C 11/1675; G11C 13/0028; G11C 13/003; G11C 11/1657; H10B 63/20; H10B 63/84; H10B 63/10; H10B 63/845; H10N 70/883
See application file for complete search history.

(56) References Cited

U.S. PATENT DOCUMENTS

| | | | |
|---|---|---|---|
| 6,937,509 B2 | 8/2005 | Perner et al. | |
| 7,733,685 B2 | 6/2010 | Scheuerlein et al. | |
| 10,157,671 B1 * | 12/2018 | Lung .................. | G11C 13/0023 |
| 2005/0237845 A1 | 10/2005 | Perner et al. | |
| 2008/0025076 A1 | 1/2008 | Scheuerlein et al. | |
| 2010/0008124 A1 | 1/2010 | Scheuerlein et al. | |

OTHER PUBLICATIONS

Chiang et al., "Design Space Analysis for Cross-Point 1S1MTJ MRAM: Selector-MTJ Cooptimization," IEEE Transactions on Electron Devices, Aug. 2020, pp. 3102-3108, vol. 67, No. 8.
Dorrance et al., "Diode-MTJ Crossbar Memory Cell Using Voltage-Induced Unipolar Switching for High-Density MRAM," IEEE Electron Device Letters, Jun. 2013, pp. 753-755, vol. 34, No. 6.
European Patent Office, Extended European Search Report mailed on Jun. 19, 2024, issued in connection with European Patent Application No. 23220097.2, 5 pages.
Kaczmarski et al., "Transparent Ru—Si—O/In—Ga—Zn—O MESFETs on Flexible Polymer Substrates," IEEE Transactions on Electron Devices, Jan. 2018, pp. 129-135, vol. 65, No. 1.
Luk et al., "2T1D Memory Cell with Voltage Gain," IEEE, 2004 Symposium on VLSI Circuits Digest of Technical Papers, 2004, pp. 184-187.

* cited by examiner

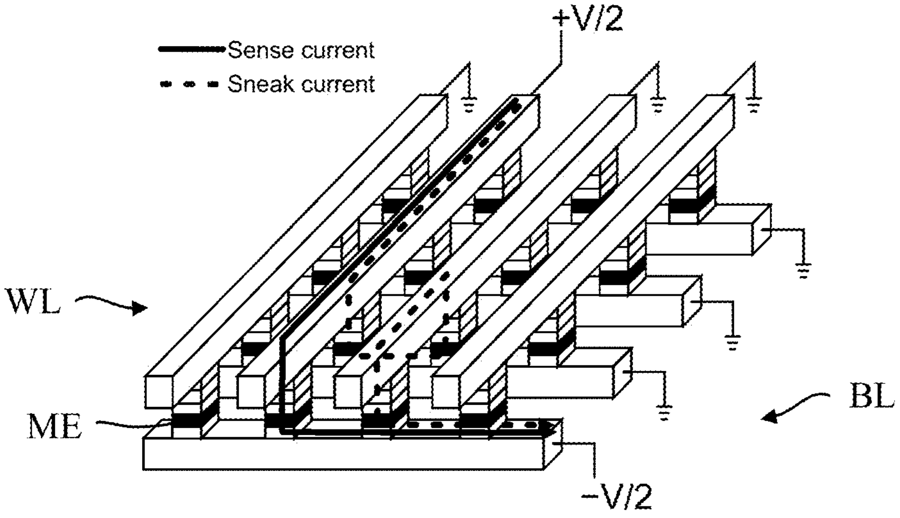
*Fig. 1 – Prior Art*
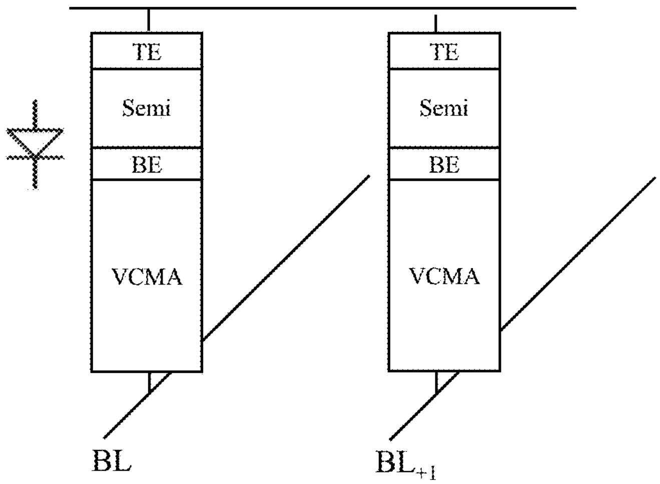
*Fig. 2 – Prior Art*

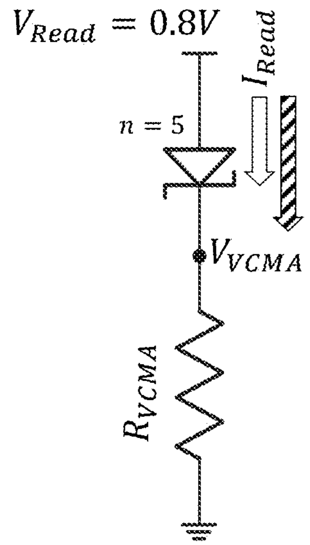
*Fig. 3A – Prior Art*
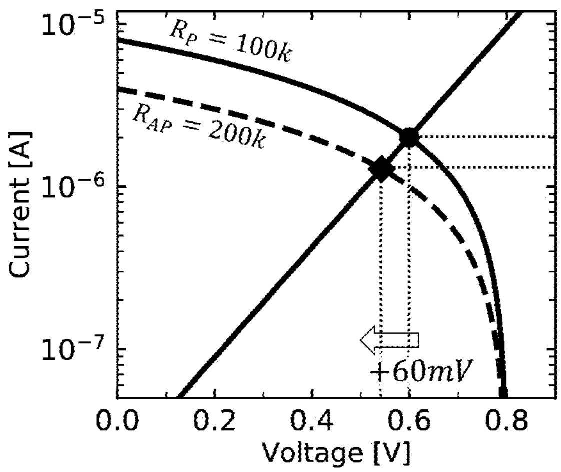
*Fig. 3B – Prior Art*
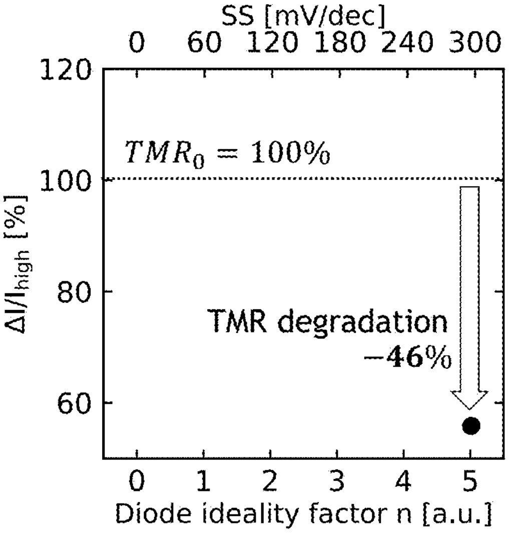
*Fig. 3C – Prior Art*

CROSS POINT MEMORY DEVICE

CROSS-REFERENCE TO RELATED APPLICATIONS

The present application is a non-provisional patent application claiming priority to European Patent Application No. EP 23220097.2, filed Dec. 22, 2023, the contents of which are hereby incorporated by reference.

FIELD OF THE DISCLOSURE

The present disclosure generally relates to a cross point memory device.

BACKGROUND

A cross point memory array comprises a plurality of parallel word lines and a plurality parallel of bit lines arranged to extend over and across each other to define an array of cross points. A resistive memory element, such as a phase-change memory (PCM), a magnetic tunnel junction (MTJ) with voltage-controlled magnetic anisotropy (VCMA), or other unipolar memory element, may be connected between the word lines and bit lines at each cross point to realize a dense array of memory cells with a small area footprint.

However, a notable drawback with such a cross point memory array is the significant leakage currents arising through half-selected memory cells during write and read operations. This is illustrated in FIG. 1, including a schematic depiction of a cross point memory array comprising word lines WL and bit lines BL and a memory element at each cross point. The solid line path indicates a sense current and the dashed line path indicates sneak currents through non-selected memory cells.

In order to suppress these so-called sneak currents, a highly non-linear two-terminal selector device may be stacked and connected in series with the resistive memory element at each cross point, to define a 1D1R memory cell (D—diode, R—resistive memory element) at each cross point. In the case of unipolar memory technologies (such as PCM or VCMA-MTJs), a Schottky diode is typically considered a good and rational choice. FIG. 2 schematically shows an example of two 1D1R memory cells at neighboring cross points between a word line WL and two bit lines BL and BL+1, each comprising a Schottky diode as selector device stacked on top of a VCMA-MTJ memory element.

While the use of a Schottky diode removes the need for a select transistor in each memory cell (which would come with a considerable area penalty), a challenge with the 1D1R memory cell is the loss of read margin (e.g. tunneling magnetoresistance ratio (TMR) in the case of VCMA). The reduced read margin may be attributed to the voltage drop across the Schottky diode selector device which will tend to affect the sense current through the memory cell differently depending on the resistance state, and thus reduce the effective resistance ratio of the high and low resistance states of the memory element.

There is hence a need for an improved design of a cross point memory device building on the area benefits and small leakage currents enabled by the 1D1R, but avoiding or mitigating read margin degradation.

SUMMARY

It is an object of the present disclosure to address at least some of the issues mentioned above. Thus, it is an object to the above provide a 1D1R-based cross point memory device of an improved design reducing or limiting read margin degradation.

Hence, according to a first aspect of the present disclosure, there is provided a cross point memory device. The cross point memory device includes first access lines and second access lines. The first access lines extend in a first direction and the second access lines extend in a second direction across the first direction to define a plurality of cross points between the first and second access lines.

The cross point memory device further includes a memory cell connected between the first access line and the second access line at each cross point and including a resistive memory element switchable between a first resistance state and a second resistance state.

Each first access line includes a metal layer and a semiconductor layer extending continuously in the first direction to define a distributed Schottky diode forming a respective selector device of each memory cell. The selector device and the resistive memory element of each memory cell are connected in series between the associated first and second access lines via an internal node of the respective memory cell.

The internal nodes of each pair of consecutive memory cells along each respective first access line are connected by a respective segment of the semiconductor layer defining a semiconductor channel configured to be gated by the metal layer of its associated first access line.

The cross point memory device further includes read circuitry configured to read the resistive memory element of a selected memory cell connected to a selected first access line and a selected second access line by: applying a select voltage to the metal layer of the selected first access line, a reference voltage to the selected second access line, a first un-select voltage to the metal layer of the non-selected first access lines, and a second un-select voltage to non-selected second access lines.

The select voltage, the reference voltage, and the first and second un-select voltages are set such that: the selector device of the selected memory cell is forward biased with a voltage exceeding a threshold voltage of the selector device, the selector devices of non-selected memory cells are either forward biased with a sub-threshold voltage, substantially zero-biased, or reverse biased, and a biasing current flows into the internal node of the selected memory cell from the non-selected second access lines, via the semiconductor channels connected to the selected memory cell.

The cross point memory device of the first aspect is based on the idea that by extending the semiconductor layer of the Schottky diode selector of each memory cell (which conventionally is separate for each memory cell) along the length of each first access line, each first access line may provide a double function of both defining a separate Schottky diode selector for each memory cell along the first access line, as well as defining a respective metal-semiconductor field-effect transistor, MESFET, with a lateral semiconductor channel, interconnecting the internal nodes of each pair of consecutive memory cells along the first access line, and having a variable resistance controllable by the voltage applied to the first access line (more specifically the voltage applied to the associated gate/metal line of the first access line).

While the diode selectors of the memory cells facilitate selective read and suppressed sneak currents, the lateral semiconductor channels of the MESFETs enables providing a controllable biasing current to the internal node of a selected memory cell to compensate for the voltage drop across the selector device and thus increase the difference between the sense currents obtained for high and low resistance states of the memory element. The select voltage applied to the metal line of the selected first access line will hence both be used as a select voltage for the selector device of the selected memory cell, and as a gate voltage for the MESFETs along the selected first access line.

Since the selector device of the selected memory cell is forward biased with a voltage exceeding a threshold voltage of the selector device, a sense current (interchangeably read current) may be conducted through the selected first access line, into and through the memory cell. The total current through the selected memory cell will be the sum of the biasing current from the non-selected second access lines received via the MESFET channels and the sense current from the selected first access line received via the selector device of the selected memory cell. Thus, even a small resistance (and hence voltage) difference between the resistive states of the resistive memory element may be amplified due to the internal gain of the selected memory cell.

The semiconductor channels defined along the respective first access lines may typically present a channel resistance which decreases with increasing gate voltage. The term "gate voltage" here refers to the voltage between the metal layer configured to gate the respective lateral semiconductor channel and either of the interconnected pair of internal nodes. With reference to the selected memory cell, the gate voltage may more specifically refer to the voltage between the metal layer of the selected first access line and the internal node of the selected memory cell. In view of the preceding discussion of the MESFETs, the first access lines may define n-channel type MESFETs wherein the internal node of the selected memory cell may act as a source for the MESFETs connected thereto.

Since the selector devices of the non-selected memory cells are either forward biased with a sub-threshold voltage, substantially zero-biased, or reverse biased, sneak currents through the selector devices of the non-selected memory cells may be efficiently suppressed.

Accordingly, with a proper selection of the select voltage, the reference voltage and the first and second un-select voltages, the cross point memory device of the first aspect may provide the sneak current suppression associated with conventional 1D1R memory cells, and at a same time avoid or mitigate the read margin degradation which otherwise is associated with such memory cells. In fact, as may be appreciated from the following, the memory device even enables achieving an amplification of the read margin above the resistance ratio the resistive memory element of a 1R memory cell would provide.

As the biasing current is supplied via the neighboring non-selected memory cells along the selected first access line, and the MESFETs are integrally formed with the first access lines, the above-mentioned technical effects may be provided without any increase in area footprint.

Furthermore, from a manufacturability point of view, it is noted that the conventional 1D1R cell may encounter material-related scaling issues, due to the need to etch the Schottky diode stack. For instance, a semiconductor layer such as InGaZnO (IGZO) may suffer from etch-induced sidewall damage that results in increased reverse leakage current. This issue becomes especially pronounced for aggressively scaled dimensions, where perimeter contribution can easily overwhelm the normal area-dependent diode current. In this respect, the distributed Schottky diode configuration of the memory device of the present aspect may be beneficial, since the resulting diode structure is confined only in direction. This can significantly improve overall diode characteristics, without compromising area footprint. In a sense, the distributed Schottky diode selector may be useful for certain semiconductor materials (e.g. oxide semiconductors such as IGZO), even without the added benefit of read margin amplification.

By the term "internal node" of a memory cell is here meant a circuit node between or common to the selector device and the memory element of the memory cell. The internal node may for instance correspond to an electrode of the memory element arranged in ohmic contact with the semiconductor layer of the respective Schottky diode selector.

By the term "selected", as in "a selected memory cell" is here meant any one of the memory cells of the memory device which during a read operation (or write operation as set out below) is selected for reading (or writing). Accordingly, the "selected" first and second access lines correspond to the respective first and second access lines, among the plurality of first and second access lines, which are connected to the selected memory cell, i.e. the memory cell selected for reading (or writing).

By the term "reference voltage" is here meant a voltage with respect to which the select and un-select voltages are defined. The reference voltage may typically correspond to a ground reference voltage (GND, i.e., approximately 0 V) but may more generally correspond to a low-level supply voltage (e.g. VSS).

By the term "resistive memory element" is here meant any conventional type of memory element being switchable between a high resistance state and a low resistance state, for instance a unipolar resistive memory element such as a voltage-controlled magnetic anisotropy (VCMA) resistive memory element or a phase change memory element.

In some embodiments, a gate threshold voltage of each lateral semiconductor channel is lower than the threshold voltage of the selector devices, wherein the select voltage, the reference voltage and the first and second un-select voltages are set such that a gate voltage for the lateral semiconductor channels along the selected first access line exceeds the gate threshold voltage and such that a gate voltage for the lateral semiconductor channels along the non-selected first access lines is less than the gate threshold voltage.

By a "gate threshold voltage" of a lateral semiconductor channel is here meant the minimum gate voltage that is needed to form a lateral conducting channel between the interconnect internal nodes. The selector devices of the non-selected memory cells along the selected first access line will be forward biased with a sub-threshold voltage, substantially zero-biased, or reverse biased when the MESFETs defined along the selected first access line are switched on. Meanwhile, the MESFETs along the non-selected first access lines may be switched off to efficiently suppress lateral sneak currents between memory cells along the non-selected first access lines.

In some embodiments, the first resistance state and the second resistance state of the resistive memory elements are respectively associated with a first resistance and a second resistance exceeding the first resistance, and wherein, responsive to the select voltage, the reference voltage, the first un-select voltage and the second un-select voltage being applied to the first and second access lines by the read circuitry during reading of the selected memory cell, each lateral semiconductor channel connected to the internal node of the selected memory cell presents a first channel resistance exceeding the second resistance of the second resistance state, and a channel resistance of each other lateral semiconductor channel along the selected first access line exceeds the first channel resistance.

The semiconductor channels defined along the respective first access lines may accordingly present a channel resistance depending on the associated gate voltage, such that the select and un-select voltages applied by the read circuitry during reading results in a lower channel resistance in the lateral semiconductor channels connected to the selected memory cell than in the other lateral semiconductor channels along the selected first access line. Lateral current conduction into internal nodes of non-selected memory cells may hence be limited reduced.

In some embodiments, the first channel resistance is at least 2 times the second resistance of the second resistance state of the resistive memory element. Thereby, a risk of disturbing the non-selected memory cells neighboring the selected memory cell (which accordingly supply the biasing current) may be mitigated. Further, the effect of the (variable) resistance of the memory elements of the non-selected neighboring memory cells on the biasing current may be limited.

In embodiments wherein the lateral semiconductor channels are configured present a distinct threshold voltage (as set out above), the first channel resistance may be defined by an on-state resistance of the lateral semiconductor channels. Correspondingly, the channel resistance of the other lateral semiconductor channels may be defined by an off-state resistance. "On-state resistance" and "off-state resistance" here refers to a respective resistance (or resistance value) of the respective lateral semiconductor channels when the gate voltage exceeds the threshold voltage and when the gate voltage is less than threshold voltage, respectively. The "off-state resistance" may in particular refer to the resistance of the respective lateral semiconductor channels when the gate voltage is less than the threshold voltage by an amount such that sub-threshold leakage is substantially zero. As the biasing conditions of the non-selected memory cells along the selected and non-selected second access lines may differ, it is to be understood that the off-state resistance may vary among the lateral semiconductor channels.

In some embodiments, the second un-select voltage corresponds to, or is greater than, the select voltage. This enables substantially zero-biasing or reverse-biasing of the non-selected selector devices. More specifically, if the second un-select voltage corresponds to the select voltage, the non-selected selector devices along the selected first access line may be substantially zero-biased. Meanwhile, the non-selected selector devices along the non-selected first access lines may be reverse-biased (under the reasonable assumption that the first un-select voltage does not exceed the select voltage). On the other hand, if the second un-select voltage is greater than the select voltage (and assuming this applies also with respect to the first un-select voltage), the non-selected selector devices may all be reverse-biased. This may further be useful to avoid or minimize sub-threshold leakage through the MESFETs, in cases where the MESFETs are not fully turned off at zero gate bias. That is, the second un-select voltage may exceed the select voltage by an amount such that a sub-threshold leakage through the lateral semiconductor channels is substantially zero.

By a voltage (such as the second un-select voltage) "corresponding to" another voltage (such as the select voltage) is hereby meant that the voltages substantially match or are substantially equal. That is, "corresponding" voltages means that the voltages need not necessarily be exactly equal to each other, but may differ to each other to some degree. Such differences may for instance at least in part be attributed to Process-Voltage-Temperature (PVT) variations. For instance, "corresponding" voltages may differ from each other by at most 10%, at most 5% or at most 2%. Voltages with a difference within these ranges may thus be considered as "corresponding" (i.e., substantially matching or be substantially equal) as these differences will be sufficiently small to not fundamentally alter the read and (and write) operations of the memory device.

In some embodiments, the first un-select voltage corresponds to or is lower than the reference voltage. By biasing the metal layers of the un-selected first access lines, a lateral resistance of the lateral semiconductor channels between non-selected memory cells may be further increased to further mitigate sneak currents. Assuming the reference voltage corresponds to ground, the first un-select voltage may accordingly be a negative voltage.

The provision of the distributed Schottky diode and MESFETs integrally formed with the first access lines further allows implementing selective programming of individual memory cells with a biasing scheme similar to the biasing scheme during read, with efficient sneak current suppression through non-selected memory cells.

Accordingly, in some embodiments the memory device further comprises write circuitry configured to program a resistance state of the resistive memory element of a memory cell selected for write (hereinafter referred to as "second selected memory cell") by: applying a write voltage to the respective first access line connected to the second selected memory cell, a reference voltage to the respective second access line connected to the second selected memory cell, a first write un-select voltage to non-selected first access lines and a second write un-select voltage non-selected second access lines (i.e. first and second access lines not connected to the second selected memory cell), wherein the write voltage, the reference voltage and the first and second write un-select voltages are set such that: the selector device of the memory cell selected for write is forward biased with a voltage exceeding the threshold voltage of the selector device, the resistive memory element of the memory cell is biased with a voltage exceeding a resistive state switching threshold voltage of the resistive memory element, and the selector devices of non-selected memory cells are either forward biased with a sub-threshold voltage, substantially zero-biased, or reverse biased.

Thereby a selective programming of the resistive memory element of the second selected memory may be provided while limiting sneak currents through non-selected memory cells, which may tend to reduce the power efficiency of the write operation.

In view of the above discussion of the meaning of the term "selected memory cell", it is to be understood that the label "second" in "second selected memory cell" merely is a label introduced to facilitate referencing the memory cell selected for write. That is, the "second selected memory cell" may be any one of the memory cells of the cross point memory device, i.e. a different memory cell than the above-discussed "selected memory cell" referenced in the discussion of the read operation (which correspondingly may be referred to as "first selected memory cell") or same memory cell as the first selected memory cell.

The reference voltage applied to the second access line connected to the second selected memory cell may typically (but is not limited to) be a same reference voltage as applied to the selected second access line connected to the first selected memory cell during read. This may reduce the complexity of the read and write schemes, and the number of bias generators needed to generate the various voltages of the read and write schemes.

By specifically setting the second write un-select voltage to correspond to the write voltage, the selector devices of the non-selected memory cells connected to the same first access line as the second selected memory cell may be substantially zero-biased, thus suppressing leakage currents there through.

In some embodiments, the first write un-select voltage corresponds to or is lower than the reference voltage. In light of the above discussion concerning the effect on gate voltage on the lateral channel resistance, it may be appreciated that a first write un-selected voltage corresponding to or being lower than the reference voltage enables an increased channel resistance, and hence a suppressed leakage.

In some embodiments, each segment of the semiconductor layer extends between a pair of electrode contact portions of the semiconductor layer, each electrode contact portions making Ohmic contact with an electrode of a respective resistive memory device, wherein a thickness dimension of the electrode contact portions exceeds a thickness dimension of the segments.

Varying a thickness dimension of the semiconductor layer along the length of the first access lines such that the local thickness of the semiconductor layer at the diode selector of each memory cell is greater than the local thickness along the segments, allows optimizing the diode selectors and the lateral semiconductor channels of the MESFETs separately. Thereby an off-state leakage of the selector devices may be effectively suppressed, while the on-state current of the selector devices remains substantially unaffected and the lateral channel thickness (and hence channel resistance) may be kept constant.

In some embodiments, each segment of the semiconductor layer of each first access line extends between a pair of electrode contact portions of the semiconductor layer, each electrode contact portions making Ohmic contact with an electrode of a respective resistive memory device, wherein a doping concentration of the segments is lower than a doping concentration of the electrode portions. Hence, the channel resistance of the lateral semiconductor channels of the MESFETs may be increased without reducing an on-state current of the selector devices.

In some embodiments, the semiconductor layer of each first access line comprises an oxide semiconductor-layer. Oxide semiconductors enable back-end-of-line compatible implementations and exist in many compositions with mobilities suitable for supplying lateral biasing currents between the memory cells as set out above. One suitable example is a layer of InGaZnO (IGZO).

In some embodiments, the metal layer of the first access lines comprises a continuous first metal sub-layer and a continuous second metal sub-layer of a work function metal arranged between the first metal sub-layer and the semiconductor layer and defining the distributed Schottky diode together with the semiconductor layer. Hence, a metal layer with a suitable work function may be provided in Schottky contact with the semiconductor layer, while a separate lower resistance metal may be provided for lowering a resistance of the first access lines.

BRIEF DESCRIPTION OF THE FIGURES

The above, as well as additional, features should be better understood through the following illustrative and non-limiting detailed description of example embodiments, with reference to the appended drawings.

This and other aspects of the present disclosure are now described in more detail, with reference to the appended drawings showing embodiments of the present disclosure.

FIG. 1 is a schematic perspective view of a conventional cross point memory array.

FIG. 2 is a schematic illustration of conventional 1D1R memory cells.

FIG. 3A-3C show, respectively, a circuit diagram of a conventional 1D1R memory cell, a graphical bias-point analysis for the 1D1R memory cell for two resistive memory element states, and a resulting estimated TMR degradation due to the voltage drop across the selector diode.

All the figures are schematic, not necessarily to scale, and generally only show parts which are necessary to elucidate example embodiments, wherein other parts may be omitted or merely suggested.

DETAILED DESCRIPTION

Example embodiments are now described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

FIG. 3A is a circuit diagram of a conventional 1D1R memory cell. In the depicted example the resistive memory element (hereinafter abbreviated ME) is a magnetic tunnel junction (MTJ) with a voltage-controlled magnetic anisotropy (VCMA) which means that the ME may be switched between a lower resistance state P and a higher resistance state AP. The following description is however equally applicable to any other unipolar ME switchable between low and high resistance states, such as PCM-based ME. For simplicity the resistance $R_{VMCA}$ of the example ME is assumed to be 100 kΩ in the low resistance state and 200 kΩ in the higher resistance state, which translates to a resistance ratio (equivalent to the TMR for an MTJ) of 100%. However, upon reading the 1D1R cell, the effective resistance ratio will become considerably smaller than this inherent resistance ratio because of the additional voltage drop across the diode selector. In FIG. 3A, the arrow without fill pattern indicates the magnitude of the sense current $I_{Read}$ for the high resistance state (where $I_{Read}$ is about 1.3 μA) and the arrow with diagonal hatching indicates the magnitude of the sense current $I_{Read}$ for the low resistance state (where $I_{Read}$ is about 2.0 μA). As illustrated in the bias-point analysis of FIG. 3B, the drop in read margin can be rather substantial. For instance, assuming a selector diode with an assumed diode ideality factor of n=5, the voltage shift between the low and high resistance states may be as small as 60 mV, assuming a read voltage of 0.8 V. Hence, instead of the initial resistance ratio of 100%, the effective resistance ratio is reduced by 46%. More specifically, this voltage shift corresponds to the additional voltage drop across the diode selector when the ME is switched from the high resistance state (200 kΩ) to the low resistance state (100 kΩ), wherein the voltage across the ME is effectively reduced (since the total 1D1R voltage is kept constant at 0.8V). Hence, the current through 1D1R will be smaller than the expected doubling. While a smaller diode ideality factor n reduces the drop in resistance ratio, this effect is present even for an ideal diode (n=1).

Figure 4:
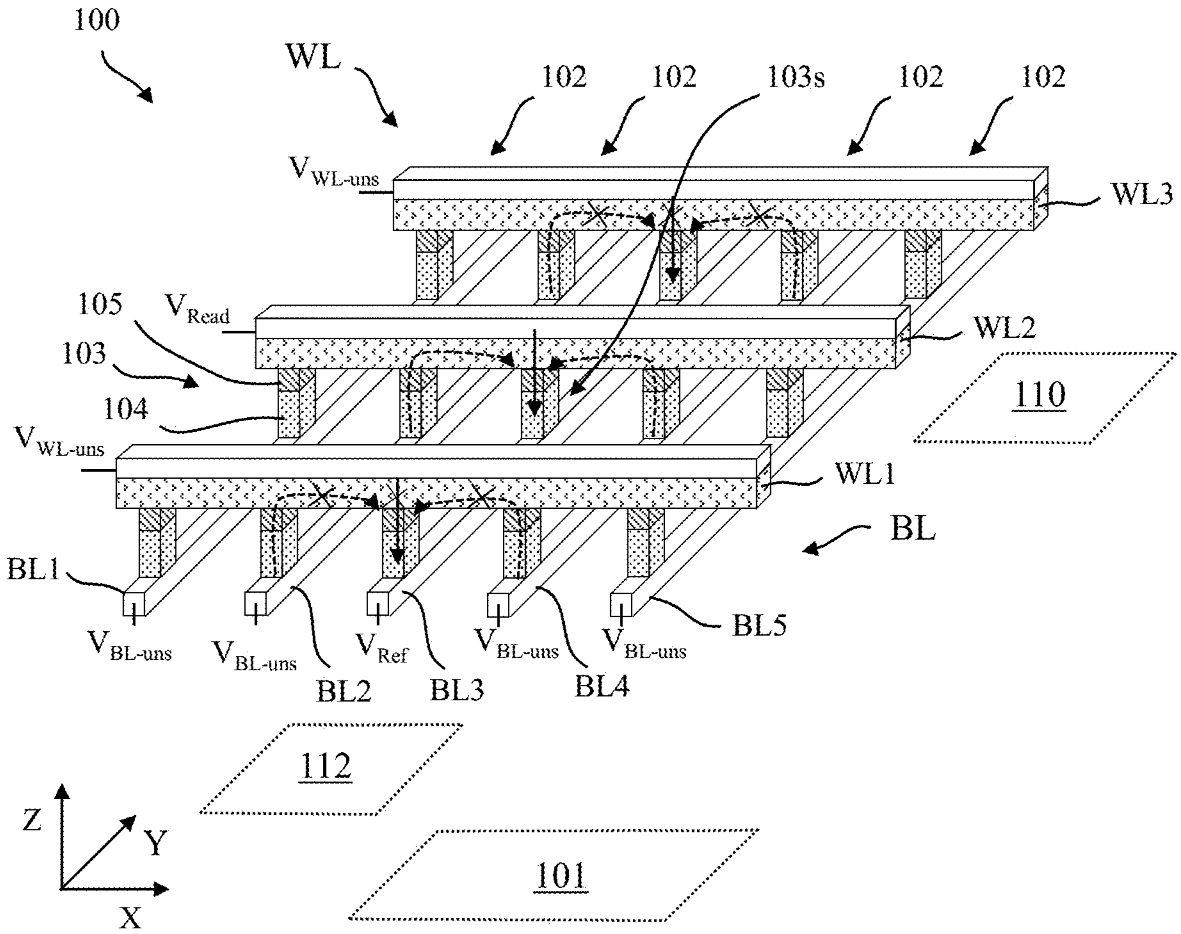
FIG. 4 is a schematic perspective view of a cross point memory device, according to an example embodiment.

FIG. 4 is a schematic perspective view of a cross point memory device 100 according to an embodiment with a design aiming to mitigate the read margin degradation illustrated in FIG. 3A-3C.

The cross point memory device is a memory device comprising a cross point array. The cross point array of the memory device 100 comprises as depicted a plurality of first access lines WL extending in parallel in a first direction X, and being spaced apart (e.g. equidistantly) along a second direction Y transverse to the first direction X. As shown, the first and second directions X, Y define respective horizontal directions, wherein "horizontal" denotes that the directions are parallel to a plane of extension of a substrate 101 of the memory device 100. The array further comprises a plurality of second access lines BL extending in parallel in the second direction Y. A plurality of cross points are hence defined between the first and second access lines WL, BL, each cross point defined at a crossing between a respective first access line and a respective second access line. The first and second access lines may as indicated by their respective designation "WL" and "BL" in FIG. 4 define word lines and bit lines of the cross point array. FIG. 4 only shows a small number of first access lines WL1, WL2, WL3 and second access lines BL1, BL2, BL3, BL4, BL5, however the memory device 100 may typically comprise a considerably larger number of first and second access lines.

Figure 5:
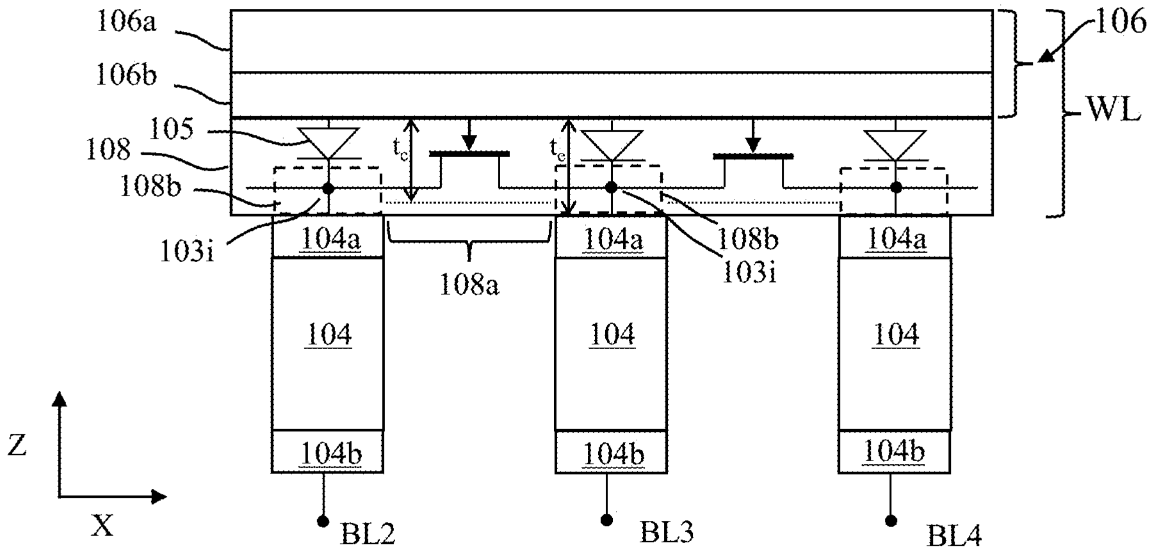
FIG. 5 is a representative schematic detail view of a section along a first access line of the cross point memory device of FIG. 4.

The memory device 100 further comprises a respective memory cell 103 arranged at each cross point and connected between the first access line WL and the second access line BL at the cross point 102. As is more clearly shown in the detail view of FIG. 5, showing a section of a first access line WL representative for any of the first access lines WL1-WL3 shown in FIG. 3, each memory cell 103 comprises a resistive memory element (ME) 104. The ME 104 is switchable between a first resistance state and a second resistance state. The ME 104 may for instance be a unipolar resistive memory element, such as a VCMA-based ME or a PCM-based ME.

Each memory cell 103 further comprises a respective Schottky diode selector 105, connected in series with the ME 104 of the memory cell 104, between the associated first and second access lines WL, BL. Each memory cell 103 is hence a 1D1R cell. In contrast to the implementation of such memory cells, the respective diode selectors along each respective first access line WL in contrast forms part of a distributed Schottky diode selector memory device 100. As shown, in FIG. 5, each first access line WL comprises a metal layer 106 and a semiconductor layer 108 extending continuously in the first direction X to define a distributed Schottky diode forming a respective selector device 105 of each memory cell 103. The selector device 105 and the ME 104 of each memory cell 103 are connected in series between the associated first and second access lines WL, BL via an internal node 103*i* of the respective memory cell 103. Moreover, the internal nodes 103*i* of each pair of consecutive memory cells 103 along each respective first access line WL are connected by a respective segment 108*a* of the semiconductor layer 108. The segment 108*a* defines a lateral semiconductor channel (in the following also designated by reference sign 108*a*) configured to be gated by the associated metal layer 106 of the first access line WL. Hence, as illustrated in FIG. 5, the first access line WL comprises a plurality of MESFETs, integrally formed with the first access line WL and comprising a lateral semiconductor channel 108*a* formed by a segment of the semiconductor layer 108, and a gate formed by the metal layer 106 of the first access line WL. The internal nodes 103*i* of each consecutive pair of memory cells 103 along the first access line WL are interconnected by the lateral semiconductor channel 108*a* of a respective one of the MESFETs.

Each segment and channel 108*a* shown may extend between a pair of electrode contact portions 108*b* of the semiconductor layer 108 (schematically indicated by dashed-line regions). Each electrode contact portion 108*b* makes Ohmic contact with an electrode 104*a* (which in the illustrated example is a top electrode) of a respective ME 104. The pair of electrode contact portions 108*b* may define the source and the drain for a respective MESFET. In the schematic depiction of FIG. 5, the internal nodes 103*i* are indicated to be located at a distance from the top electrode 104*a* of the respective MEs 104, within the electrode contact portions 108*b*. However, as may be appreciated this location is somewhat arbitrary and may just as well be considered to be collocated with the top electrode 104*a*.

Using a proper biasing scheme, the selector devices 105 of the memory cells 103 allow selective read and suppressed sneak currents. Meanwhile, as is further described below, the lateral semiconductor channels 108*a* of the MESFETs interconnecting the memory elements 103 enables providing a controllable biasing current to the internal node 103*i* of a selected memory cell 103*s* during read operation, to compensate for the voltage drop across the selector device 105 and thus increase a total current through the memory element 104 of the selected memory cell 103*s*. The select voltage applied to the metal line 106 of the selected first access line WL will hence both be used as a select voltage for the selector device 105 of the selected memory cell 103*s*, and as a gate voltage for the MESFETs along the selected first access line WL.

The semiconductor layers 108 of the first access lines WL may typically be n-type semiconductor layers, wherein the lateral semiconductor channels 108*a* may define n-type semiconductor channels. The MESFETs will in the following be assumed to comprise an n-type lateral semiconductor channel 108*a* having a channel resistance which decreases with increasing gate voltage. The MESFETs may be configured to operate in either enhancement-mode (implying a threshold voltage of about 0 V or greater) or depletion-mode (implying a threshold voltage below 0 V). The semiconductor layer 108 may comprises an oxide semiconductor-layer. Non-limiting examples include a layer of InGaZnO (IGZO), ZnO, InWO, InSnO or GaZnO. The thickness of the semiconductor layer 108 may be chosen in view of the target biasing conditions, on state current, off state current, etc.

The metal layer 106 may as shown in FIG. 5 comprise a stack of a first metal sub-layer 106*a* and a continuous second metal sub-layer 106*b* of a work function metal (WFM) arranged between the first metal sub-layer 106*a* and the semiconductor layer 108 and defining the distributed Schottky diode together with the semiconductor layer 108. The second metal sub-layer 106*b* may be formed of a metal with a suitably work function (e.g. higher than the electron affinity of the semiconductor layer 108), to obtain a desired Schottky barrier height. For an IGZO-semiconductor layer 108, a non-limiting example for the second metal sub-layer 106*b* is Pt. The first metal sub-layer 106*a* may be chosen to enable a low resistance connection to the memory cells 103 along the first access lines WL. The first metal sub-layer 106*a* may be formed by one or more metals typically used for metal line interconnects in the back end of line, such as W, Al, Cu, etc. However, provided a WFM with both a suitable work function and sufficiently low resistance is found, a single metal layer composition of the metal layer 106 is also possible.

Optionally, a doping concentration of the semiconductor layer 108 may be varied along its length such that a doping concentration in the segments 108*a* is lower than a doping concentration in the electrode portions 108*b*. Thereby, the channel resistance of the semiconductor channels 108*a* of the MESFETs may be tuned without reducing an on-state current of the selector devices 105.

FIG. 5 further indicates an optional variation of the first access line WL, wherein a thickness dimension the of the electrode contact portions 108*b* exceeds a thickness dimension $t_c$ of the segments 108*a*. This design variation may be applied separately or in combination with a varying doping concentration, to allow optimizing the diode selectors and the lateral semiconductor channels of the MESFETs separately.

The cross point array, including the first and second access lines WL, BL and the memory cells 103 may be comprised in an interconnect structure of the memory device 100. The first and second access lines WL, BL may be arranged in respective interconnect levels (metallization levels) of the interconnect structure. In the illustrated example, the first access lines WL are arranged above the second access lines BL, however the opposite configuration is also possible. In that case, the memory cells 103 will accordingly be arranged on top of the first access lines WL, and the second metal sub-layer 106*b* will be formed on top of the first metal sub-layer 106*a*. Additionally, the selector device 105 will be connected to a bottom electrode 104*b* of the ME 104.

Figure 6:
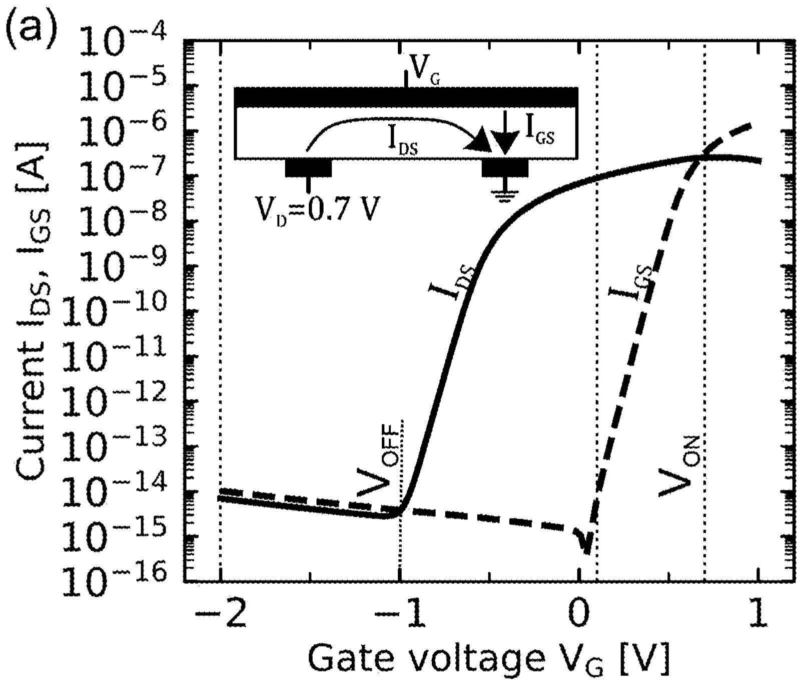
FIG. 6 shows simulations of a drain-to-source current through a MESFET defined along the first access line and a diode selector current as a function of gate-to-source voltage applied to the metal layer of the first access line.

FIG. 6 shows a simulation of a drain-to-source current $I_{DS}$ through the lateral semiconductor channel of a MESFET between a pair of consecutive memory elements along the first access line WL shown in FIG. 5 as a function of gate voltage Vg (i.e. gate-to-source voltage). Further shown is a simulation of the selector current (i.e. gate-to-source current) $I_{GS}$ through the Schottky diode selector of one of the memory cells as a function of gate voltage. As may be seen, both the MESFET and the Schottky diode selector may present a respective distinct gate threshold voltage above which the drain-to-source current $I_{DS}$ and the selector current, respectively, increases abruptly. In the illustrated simulation, the gate threshold voltage of the MESFET is a negative voltage and lower than the threshold voltage of the diode selector. However, in general, the specific value of the gate threshold voltage and the selector threshold voltage depend on parameters such as the doping concentration of the semiconductor layer, the thickness of the semiconductor layer, and the Schottky barrier height. In any case, FIG. 6 demonstrates that a first access line WL, with a configuration as shown in FIG. 5, may simultaneously define a MESFET and a Schottky diode selector with distinct respective threshold voltages separating their respective off- and on-states. However, the read and write operations as set out herein will work also if threshold voltages of the MESFETs and diode selectors are substantially equal.

Figure 7:
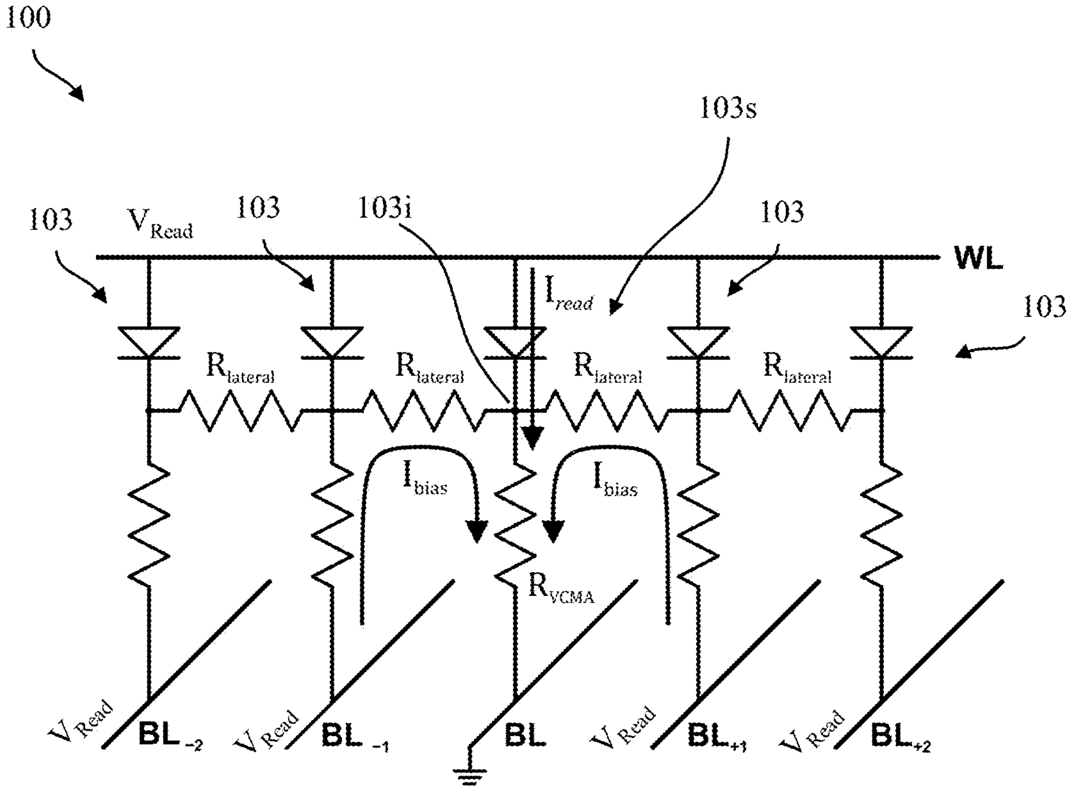
FIG. 7 is a circuit diagram showing the flow of a biasing current into an internal node of a selected memory cell during read.

FIG. 7 is a circuit diagram showing how the MESFETs of the first access line WL may be used to conduct a biasing current into an internal node of a selected memory cell 103*s* during read. The selected memory cell 103*s* is located at the cross point between the first access line WL and the second access line BL, which may correspond to any one of the first and second access lines shown in FIG. 4. The selected memory cell is biased by select voltage $V_{read}$. The non-selected memory cells are substantially zero-biased by applying the select voltage $V_{read}$ also to the non-selected bit lines $BL_{-1}$, $BL_{+1}$, $BL_{-2}$, $BL_{+2}$. For simplicity, the MESFET circuit symbols are here replaced by resistor symbols where $R_{lateral}$ denotes the channel resistance of the lateral semiconductor channels at the depicted biasing condition. Interconnecting consecutive internal nodes along the first access line WL. Assuming $R_{lateral}$ is reasonably large (e.g. comparable to or greater than the resistance of the ME 104) the total biasing current flowing into the internal node 103*i* will be dominated by the current sourced from the two nearest neighbouring bit lines, i.e. $2*I_{bias}$, as the resistance between farther bit lines and the internal node 103*i* will be significantly larger. This may further contribute to limit a lateral current flow between non-selected memory cells 103 along the selected first access line WL. Thus, the lateral semiconductor channels 103 may be configured to present a lateral channel resistance $R_{lateral}$ which is comparable to or exceeds the resistance of the high resistance state of the ME, both in an on-state and an off-state of the MESFETs. More specifically, denoting the resistance of the lateral semiconductor channel of a MESFET in an on-state by "first channel resistance" $R_{lateral,on}$, and the resistance of the lateral semiconductor channel of the MESFET in an off-state by "second channel resistance" $R_{lateral,off}$, each of the first channel resistance $R_{lateral,on}$ and the second channel resistance $R_{lateral,off}$ may exceed the resistance of the high resistance state of the ME, i.e. $R_{lateral,on}>R_{AP}$ and $R_{lateral,off}>R_{AP}$. For example $R_{lateral,on}$ and $R_{lateral,off}$ may each be at least 2 times $R_{AP}$. On the other hand, provided the first channel resistance $R_{lateral,on}$ is at most 15 times $R_{AP}$, a sufficient biasing current may be provided for a practical range of read bias voltages. As a further example, a ratio of the first channel resistance $R_{lateral,on}$ of the lateral semiconductor channel to the resistance $R_{VCMA}$ of the ME may be in a range from 5-10, for either of $R_{VCMA}=R_P$ or $R_{VCMA}=R_{AP}$. This may strike a reasonable balance between low read disturb and sufficient biasing current.

Figure 8:
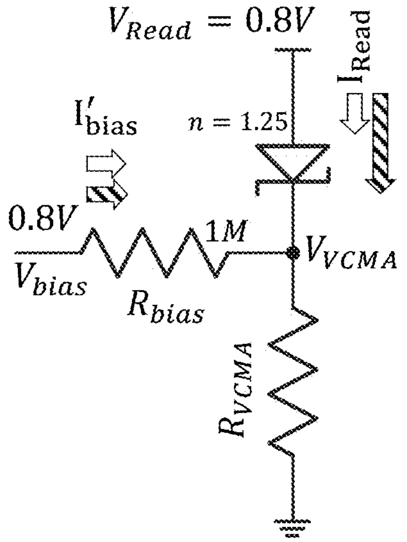
FIG. 8 is a simplified circuit diagram illustrating the effect of supplying a biasing current to an internal node of a memory cell.

To facilitate understanding of the effect of supplying a biasing current to an internal node of a selected memory cell, reference is made to the FIG. 8, showing a circuit diagram of a memory cell simplified to consider only a single biasing current from one neighbouring memory element, as opposed to two as in FIG. 8. In the figure, the arrows without fill pattern indicates the magnitude of the sense current $I_{Read}$ received from the access line and the bias current $I_{bias}'$, respectively, for the high resistance state and the arrow with diagonal hatching indicates the magnitude of the sense current $I_{Read}$ and the bias current $I_{bias}'$, respectively, for the low resistance state.

From the circuit diagram it may be seen that the voltage $V_{VCMA}$ at the internal node is given by:

$$V_{VCMA} = \frac{R_{VCMA}}{R_{VCMA} + R_{bias}} \cdot V_{bias}$$

where $R_{VCMA}$ like before denotes the resistance of the ME (e.g. $R_{VCMA}=R_{AP}$ or $R_{VCMA}=R_P$) and $V_{bias}$ corresponds to the voltage at the internal node of the neighbouring memory element. This expression is an approximation valid in the regime when the current through the diode selector $I_{Read}$ is small compared to the biasing current $I_{bias}'$. The sense current $I_{Read}$ is then given by:

$$I_{Read} = I_0 \exp\left(\frac{q(V_{Read} - V_{VCMA})}{nkT}\right)$$

The effective resistance ratio is in turn proportional to:

$$TMR \sim \exp(q\Delta V_{VCMA}/nkT)$$

where $\Delta V_{VCMA}$ is the difference between $V_{VCMA}$ when $R_{VCMA}=R_{AP}$ and $R_{VCMA}=R_P$, respectively. Table 1 shows the values of the biasing current $I_{bias}'$, $V_{VCMA}$, $I_{read}$ and the TMR for a read voltage $V_{read}$=0.8 V, a bias voltage $V_{bias}=V_{read}$, $R_P$=100 kΩ and $R_{AP}$=200 kΩ.

TABLE 1

| | P | | AP |
|---|---|---|---|
| $R_{VCMA}$ | 100 kΩ | | 200 kΩ |
| $TMR_0$ | | 100% | |
| $I'_{bias}$ | 0.59 μA | | 0.57 μA |
| $V_{VCMA}$ | 205 mV | | 235 mV |
| $I_{Read}$ | 1.47 μA | | 0.61 μA |
| TMR | | 140% | |

Hence, as may be seen, a biasing current may considerably increase the resistance ratio during read.

With reference again to FIG. 4, there is shown a biasing scheme for reading a selected memory cell 103*s* of a cross point array. In the depicted example, the selected memory cell 103*s* is the memory cell among the memory cells 103 connected between the first access line WL2 and the second access line BL3. The biasing voltages of the read scheme may be provided by read circuitry 110, 112. The read circuitry 110, 112 may as per se is known in the art comprise word line and bit line drivers, sense amplifier circuits, etc. The read circuitry 110, 112 may be implemented by CMOS circuitry in a manner which per se is known in the art. The active devices of the writing circuitry 110, 112 may be formed on a front side of the substrate 101, below the cross point array.

In the figure, $V_{Read}$ denotes the select voltage (or read voltage) applied to the selected first access line WL2, more specifically to its associated metal layer 106 (e.g. the first metal sub-layer 106*a*). $V_{Ref}$ denotes a reference voltage applied to the selected second access line BL3. The reference voltage $V_{Ref}$ may typically be a ground reference voltage GND (i.e. approximately 0 V). $V_{WL\text{-}uns}$ denotes a first un-select voltage applied to non-selected first access lines WL1, WL3, more specifically to its associated metal layer 106 (e.g. the first metal sub-layer 106*a*). $V_{BL\text{-}uns}$ denotes a second un-select voltage applied to non-selected second access lines BL1, BL2, BL4, BL5.

According to the read biasing scheme implemented by the read circuitry 110, 112, the select voltage $V_{Read}$, the reference voltage $V_{Ref}$ and the first and second un-select voltages $V_{WL\text{-}uns}$, $V_{BL\text{-}uns}$ are set such that:

- the selector device 105 of the selected memory cell 103*s* is forward biased with a voltage exceeding a threshold voltage of the selector device 105,
- the selector devices 105 of non-selected memory cells 103 are either forward biased with a sub-threshold voltage, substantially zero-biased, or reverse biased, and
- a sufficient biasing current $I_{bias}$ flows into the internal node 103*i* (see FIG. 5) of the selected memory cell 103*s* from the non-selected second access lines BL1, BL2, BL4, BL5, via the lateral semiconductor channels 108*a* of the MESFETs connected to the selected memory cell 103*s*.

In one example implementation, the reference voltage $V_{Ref}$ may correspond to ground (~0 V), the select voltage $V_{Read}$ may be a positive voltage exceeding a gate threshold voltage of the MESFETs and the threshold voltage of the selector device 105, the first un-select voltage may be set to $V_{WL\text{-}uns} \leq V_{Ref}$ and the second un-select voltage may be set to $V_{BL\text{-}uns} \approx V_{Read}$.

By this biasing scheme, the selector device 105 of the selected memory cell 103*s* may be switched on and forward biased so that a sense current may flow from the selected first access line WL2 into the selected memory cell 103*s*. Meanwhile, the selector device 105 of non-selected memory cells 103 along the selected first access line WL2, may be either forward biased with a sub-threshold voltage or substantially zero-biased (depending on the voltage drop across the associated ME 104) and hence remain switched off.

If $V_{WL\text{-}uns} \approx V_{Ref}$ the selector device 105 of non-selected memory cells 103 along the non-selected first access lines WL1, WL3, may be reverse biased with a. If $V_{WL\text{-}uns} < V_{Ref}$ the selector device 105 of non-selected memory cells 103 along non-selected first access lines WL1, WL3, may be reverse biased even more strongly. Additionally, by setting the first un-select voltage $V_{WL\text{-}uns}$ smaller than $V_{Ref}$ the gate voltage of the MESFETs of the non-selected first access lines WL1, WL3 may be negative, thereby increasing the lateral channel resistance $R_{lateral}$ along the non-selected first access lines WL1, WL3. This may further suppress lateral sneak currents between memory cells 103 along the non-selected first access lines WL1, WL3 during read.

Additionally, responsive to the second un-select voltage $V_{BL\text{-}uns} \approx V_{Read}$ in combination with the select voltage $V_{Read}$ acting as gate voltage for the MESFETs along the selected first access line WL2, a biasing current may be supplied to the internal node 103*i* of the selected memory cell 103*s*. As discussed above, the biasing current will typically be dominated by the contribution from the nearest neighboring second access lines BL2 and BL4 to the selected second access line BL3.

Figure 9:
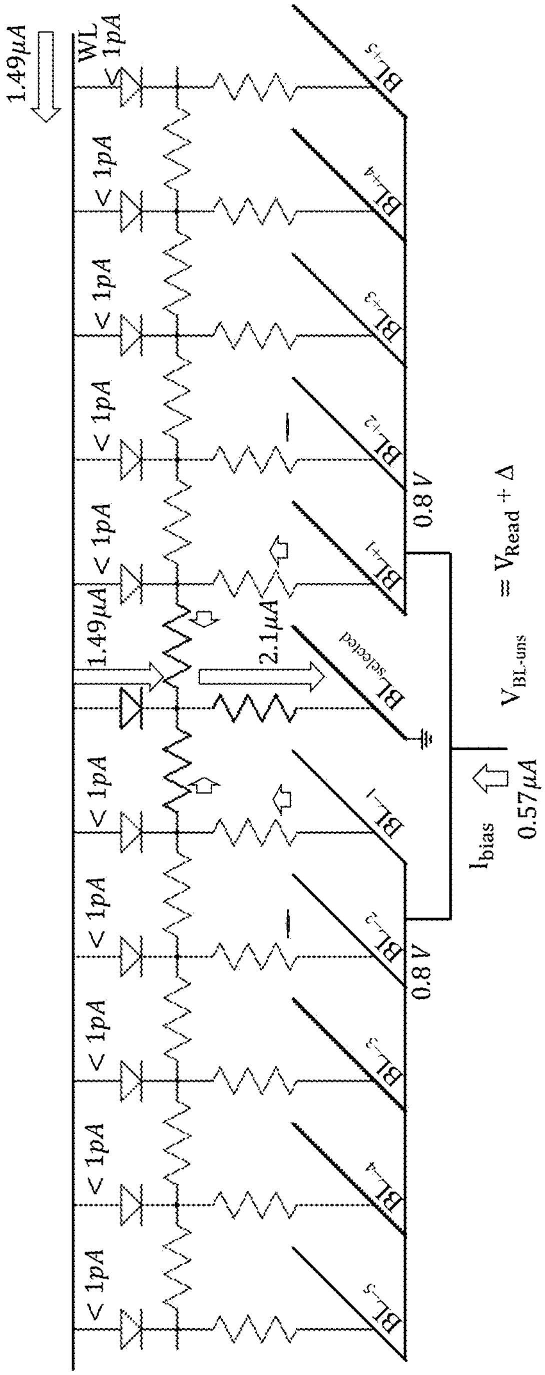
FIG. 9 shows a simulation of currents through a selected memory cell and its five nearest neighboring memory cells along the selected first access line for an example read biasing scheme.

FIG. 9 shows a simulation of currents through a selected memory cell along the first access line WL for an example read biasing scheme for a select voltage $V_{Read}$. The lateral semiconductor channel is modelled as a fixed resistance $R_{lateral}$=2 MΩ. The ME of each of the memory cells is assumed to be in the first/low resistance state so that $R_{VCMA}=R_P$=100 kΩ. The resulting biasing current supplied to the internal node 103 of the selected memory cell is as shown 0.57 μA. This gives a sense current of 1.49 μA along the selected first access line. Performing a corresponding simulation for $R_{VCMA}=R_{AP}=200$ kΩ gives a biasing current of 0.54 μA and a sense current of 0.63 μA, which translates to a TMR of about 138%. Assuming a less favorable condition, wherein the ME of all non-selected memory cells are set to the second/high resistance state, biasing currents and the sense currents for the P and AP states become, respectively, 0.55 μA/0.52 μA and 1.51 μA/0.64 μA, which translates to a TMR of 134%.

From the expression derived for the internal node voltage $V_{VCMA}$ for FIG. 8, it may be appreciated that the biasing of a memory cell may be increased by increasing the ratio $R_{VCMA}/R_{lateral}$. Additionally, the internal node voltage $V_{VCMA}$ may be increased by increasing the voltage $V_{BL\text{-}uns}$ on the non-selected second access lines. In particular, $V_{BL\text{-}uns}$ may as shown in FIG. 9 be increased by Δ over $V_{Read}$. Consequently, the selector devices of the non-selected memory cells become reverse biased. Hence, the practical limit of Δ is determined by the maximum reverse-bias voltage the selector devices may withstand.

Figure 10:
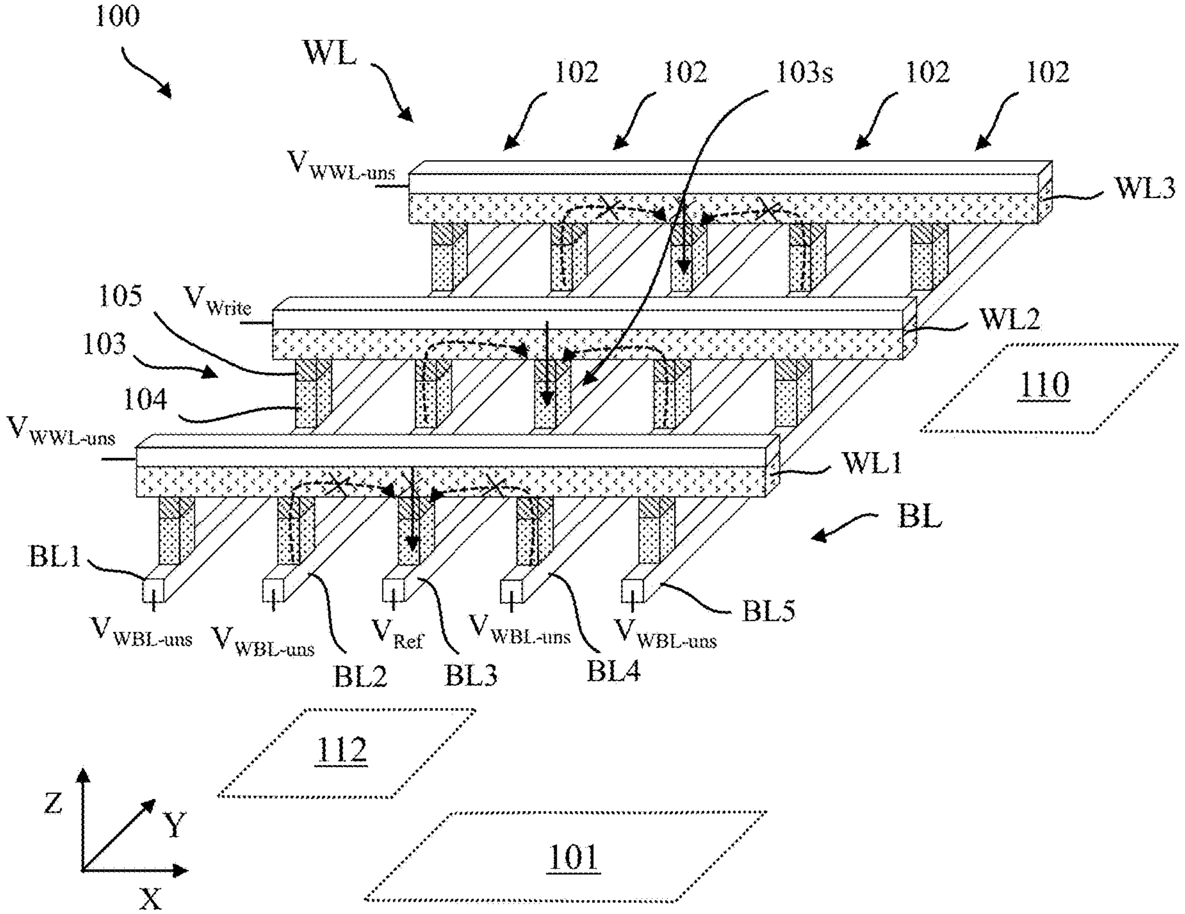
FIG. 10 is a schematic perspective view of a cross point memory device according to an example embodiment during write mode.

A biasing scheme for implementing a write operation is now described with reference to FIG. 10. The biasing voltages of the write scheme may be provided by write circuitry, which may be comprised in the same CMOS circuitry as the read circuitry 110, 112 and hence in FIG. 10 is indicated with the same reference signs. The write operation is described with reference to the same memory cell as the selected memory cell 103*s* of the read operation, but may of course be applied in a corresponding fashion to any one of the memory cells 103.

In the figure, $V_{Write}$ denotes the write voltage (or program voltage) applied to the selected first access line WL2, more specifically to its associated metal layer 106 (e.g. the first metal sub-layer 106*a*). $V_{Ref}$ denotes a reference voltage applied to the selected second access line BL3. The reference voltage $V_{Ref}$ may typically be a ground reference voltage GND (i.e. approximately 0 V). $V_{WWL\text{-}uns}$ denotes a first write un-select voltage applied to non-selected first access lines WL1, WL3, more specifically to its associated metal layer 106 (e.g. the first metal sub-layer 106*a*). $V_{WBL\text{-}uns}$ denotes a second write un-select voltage applied to non-selected second access lines BL1, BL2, BL4, BL5.

According to the write biasing scheme implemented by the write circuitry 110, 112, the write voltage $V_{Write}$, the reference voltage $V_{Ref}$ and the first and second write un-select voltages $V_{WWL\text{-}uns}$, $V_{WBL\text{-}uns}$ are set such that:

- the selector device 105 of the selected memory cell 103*s* is forward biased with a voltage exceeding the threshold voltage of the selector device 105,
- the ME 104 of the selected memory cell 103*s* is biased with a voltage exceeding a resistive state switching threshold voltage of the ME 104, and
- the selector devices 105 of the non-selected memory cells 103 are either forward biased with a sub-threshold voltage, substantially zero-biased, or reverse biased.

In one example implementation, the reference voltage $V_{Ref}$ may correspond to ground (~0 V), the write voltage $V_{Write}$ may be a positive voltage exceeding the resistive state switching threshold voltage of the ME 104 and the threshold voltage of the selector device 105, the first write un-select voltage may be set to $V_{WWL\text{-}uns} \leq V_{Ref}$ and the second un-select voltage may be set to $V_{WBL\text{-}uns} \approx V_{Write}$.

By this biasing scheme, the selector device 105 of the selected memory cell 103*s* may be switched on and forward biased so that a write current may flow from the selected first access line WL2 into the selected memory cell 103*s* and through the ME 104. Meanwhile, the selector device 105 of non-selected memory cells 103 along the selected first access line WL2, may be either forward biased with a sub-threshold voltage or substantially zero-biased (depending on the voltage drop across the associated ME 104) and hence remain switched off.

However, setting $V_{WBL\text{-}uns} \approx V_{Write}$ results in a voltage difference which will drive a leakage current flowing from the second access lines BL2, BL4 into the internal node 103*i* of the selected memory cell 103*s*, via the lateral semiconductor channels 108*a* of the MESFETs (shown in FIG. 5) connected to the internal node 103*i*. It is however envisaged that the channel resistance $R_{lateral}$ of the lateral semiconductor channels of the MESFETs, when gated by a voltage of a level typical for writing resistive memory elements (e.g. by way of example 1-2 V), is comparable to or exceeds the resistance of the resistive memory element during programming, such that the leakage currents may be kept small enough to avoid write disturb. Low leakage is further enabled due to that during Write operation, voltage of the internal node 103*i* of the selected cell 103*s* will be substantially increased, resulting in a decrease in voltage drop between source and drain of the MESFET.

Turning to the first write un-selected voltages, if $V_{WLL\text{-}uns} \approx V_{Ref}$ the selector device 105 of the non-selected memory cells 103 along the non-selected first access lines WL1, WL3, may be reverse biased. If $V_{WWL\text{-}uns} < V_{Ref}$ the selector device 105 of non-selected memory cells 103 along non-selected first access lines WL1, WL3, may be more strongly reverse biased and hence remain switched off. Additionally, by setting the first un-select voltage $V_{WL\text{-}uns}$ smaller than $V_{Ref}$ the gate voltage of the MESFETs of the non-selected first access lines WL1, WL3 may be negative, thereby increasing the lateral channel resistance $R_{lateral}$ along the non-selected first access lines WL1, WL3. This may further suppress lateral sneak currents between memory cells 103 along the non-selected first access lines WL1, WL3 during write.

The person skilled in the art realizes that the present disclosure by no means is limited to the embodiments described above. On the contrary, many modifications and variations are possible within the scope of the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A cross point memory device, comprising:

first access lines and second access lines, the first access lines extending in a first direction and the second access lines extending in a second direction across the first direction to define a plurality of cross points between the first access lines and the second access lines; and a memory cell connected between a respective first access line and a respective second access line at each cross point and comprising a resistive memory element switchable between a first resistance state and a second resistance state;

wherein each first access line comprises a metal layer and a semiconductor layer extending continuously in the first direction to define a distributed Schottky diode forming a respective selector device of each memory cell, wherein the selector device and the resistive memory element of each memory cell are connected in series between the associated first and second access lines via an internal node of the respective memory cell, and wherein the internal nodes of each pair of consecutive memory cells along each respective first access line are connected by a respective segment of the semiconductor layer defining a lateral semiconductor channel configured to be gated by the metal layer of its associated first access line, wherein the cross point memory device further comprises read circuitry configured to read the resistive memory element of a selected memory cell connected to a selected first access line and a selected second access line by: applying a select voltage to the metal layer of the selected first access line, a reference voltage to the selected second access line, a first un-select voltage to the metal layer of non-selected first access lines, and a second un-select voltage to non-selected second access lines, and wherein the select voltage, the reference voltage, and the first and second un-select voltages are set such that:

the selector device of the selected memory cell is forward biased with a voltage exceeding a threshold voltage of the selector device, the selector devices of non-selected memory cells are either forward biased with a sub-threshold voltage, substantially zero-biased, or reverse biased, and a biasing current flows into the internal node of the selected memory cell from the non-selected second access lines, via the semiconductor channels connected to the selected memory cell.

2. The cross point memory device according to claim 1, wherein a gate threshold voltage of each lateral semiconductor channel is lower than the threshold voltage of the selector devices, and wherein the select voltage, the reference voltage and the first and second un-select voltages are set such that a gate voltage for the lateral semiconductor channels along the selected first access line exceeds the gate threshold voltage and such that a gate voltage for the lateral semiconductor channels along the non-selected first access lines is less than the gate threshold voltage.

3. The cross point memory device according to claim 1, wherein the first resistance state and the second resistance state of the resistive memory elements are respectively associated with a first resistance and a second resistance exceeding the first resistance, and wherein, responsive to the voltages being applied by the read circuitry during reading of the selected memory cell, each lateral semiconductor channel connected to the internal node of the selected memory cell presents a first channel resistance exceeding the second resistance of the second resistance state, and a channel resistance of each other lateral semiconductor channel along the selected first access line exceeds the first channel resistance.

4. The cross point memory device according to claim 3, wherein the first channel resistance is at least two times the second resistance.

5. The cross point memory device according to claim 3, wherein the first channel resistance is an on-state resistance of the lateral semiconductor channels.

6. The cross point memory device according to claim 1, wherein the second un-select voltage corresponds to, or is greater than, the select voltage.

7. The cross point memory device according to claim 1, wherein the first un-select voltage corresponds to or is lower than the reference voltage.

8. The cross point memory device according to claim 1, further comprising write circuitry configured to program a resistance state of the resistive memory element of a memory cell selected for write by: applying a write voltage to the respective first access line connected to the memory cell, a reference voltage to the respective second access line connected to the memory cell, a first write un-select voltage to non-selected first access lines, and a second write un-select voltage to non-selected second access lines, wherein the write voltage, the reference voltage and the first and second write un-select voltages are set such that: the selector device of the memory cell selected for write is forward biased with a voltage exceeding the threshold voltage of the selector device, the resistive memory element of the memory cell is biased with a voltage exceeding a resistive state switching threshold voltage of the resistive memory element, and the selector devices of non-selected memory cells are either forward biased with a sub-threshold voltage, substantially zero-biased, or reverse biased.

9. The cross point memory device according to claim 8, wherein the second write un-select voltage corresponds to the write voltage.

10. The cross point memory device according to claim 9, wherein the first write un-select voltage corresponds to or is lower than the reference voltage.

11. The cross point memory device according to claim 1, wherein each segment extends between a pair of electrode contact portions of the semiconductor layer, each electrode contact portion making Ohmic contact with an electrode of a respective resistive memory device, wherein a thickness dimension of the electrode contact portions exceeds a thickness dimension of the segments.

12. The cross point memory device according to claim 1, wherein each segment extends between a pair of electrode contact portions of the semiconductor layer, each electrode contact portion making Ohmic contact with an electrode of a respective resistive memory device, and wherein a doping concentration of the segments is lower than a doping concentration of the electrode portions.

13. The cross point memory device according to claim 1, wherein the semiconductor layer of each first access line comprises an oxide semiconductor-layer, such as an IGZO-layer.

14. The cross point memory device according to claim 1, wherein the metal layer comprises a continuous first metal sub-layer and a continuous second metal sub-layer of a work function metal arranged between the first metal sub-layer and the semiconductor layer and defining the distributed Schottky diode together with the semiconductor layer.

15. The cross point memory device according to claim 14, wherein the continuous second metal sub-layer is formed of a metal with a work function higher than an electron affinity of the semiconductor layer.

16. The cross point memory device according to claim 14, wherein a doping concentration of the semiconductor layer is varied along a length of the semiconductor layer.

17. The cross point memory device according to claim 14, wherein the first metal sub-layer is formed by one or more metals used for metal line interconnects in back end of line.

18. The cross point memory device according to claim 1, wherein each resistive memory device is a unipolar resistive memory element, such as a voltage-controlled magnetic anisotropy resistive memory element or a phase change memory element.

19. The cross point memory device according to claim 1, wherein the semiconductor layers of the first access lines are n-type semiconductor layers.

20. The cross point memory device of claim 1, wherein each lateral semiconductor channel is defined as an n-type semiconductor channel.

* * * * *